(12) United States Patent
Sirringhaus et al.

(10) Patent No.: US 7,709,306 B2
(45) Date of Patent: May 4, 2010

(54) ACTIVE LAYER ISLAND

(75) Inventors: Henning Sirringhaus, Cambridge (GB); Catherine Ramsdale, Cambridge (GB)

(73) Assignee: Plastic Logic Limited, Cambridge (GB)

( * ) Notice: Subject to any disclaimer, the term of this patent is extended or adjusted under 35 U.S.C. 154(b) by 1000 days.

(21) Appl. No.: 10/542,546

(22) PCT Filed: Jan. 19, 2004

(86) PCT No.: PCT/GB2004/000161

§ 371 (c)(1),
(2), (4) Date: Feb. 18, 2006

(87) PCT Pub. No.: WO2004/066477

PCT Pub. Date: Aug. 5, 2004

(65) Prior Publication Data

US 2006/0160277 A1    Jul. 20, 2006

(30) Foreign Application Priority Data

Jan. 17, 2003   (GB)   ................... 0301089.9

(51) Int. Cl.
*H01L 21/00* (2006.01)
*H01L 21/84* (2006.01)
(52) U.S. Cl. .................. 438/151; 438/161; 438/163; 438/164; 257/E29.242
(58) Field of Classification Search ................ 438/151, 438/161, 163, 164; 257/E29.242, E29.255
See application file for complete search history.

(56) References Cited

U.S. PATENT DOCUMENTS 6,723,394 B1 *  4/2004  Sirringhaus et al. .......... 428/1.1

2002/0119584 A1    8/2002  Duthaler et al.

FOREIGN PATENT DOCUMENTS

WO        WO 01/46987 A        6/2001

OTHER PUBLICATIONS

Kawase, T. et al., "All-Polymer Thin Film Transistors Fabricated by Inkjet Printing", Proceedings of the SPIE, SPIE, Bellingham, VA, US vol. 4466, Jul. 29, 2001, pp. 80-88, XP008006102, ISSN: 0277-786X.
Chabinyc Michael L, et al., "Organic Polymeric Thin-film Transistors Fabricated by Selective Dewetting", Applied Physics Letters, American Institute of Physics, New York, US, vol. 81, No. 22, Nov. 25, 2002, 4260-4262, XP012032662, ISSN: 0003-6951.
Zhang, J. et al., Investigation of Using Contact and Non-contact Printing Technologies For Organic Transistor Fabrication, Material Research Society Symposium Proceedings, Materials Research Society, Pittsburg, PA, US, vol. 725, Apr. 1, 2002, pp. 155-160, XP008020720, ISSN: 0272-9172.

(Continued)

*Primary Examiner*—David S Blum
(74) *Attorney, Agent, or Firm*—Sughrue Mion, PLLC

(57) ABSTRACT

A method for forming an electronic device including at least one electrically conductive and one semiconductive material deposited from solution, the method comprising: forming on the substrate a confinement structure consisting of a least a first zone and a second zone, depositing the electrically conductive material on the substrate, wherein the electrically conductive material is absent from both the first and second zone, and subsequently depositing the electrically semiconductive material from solution, wherein the semiconductive material is absent from the first zone, but not from the second zone.

51 Claims, 9 Drawing Sheets

OTHER PUBLICATIONS

Pede, D., et al., Microfabrication of Conducting Polymer Devices by Ink-jet Stereolithography, Materials Science and Engineering C, Elsevier Sicence S.A, CH, vol. C05, No. 3/4, Feb. 1998, pp. 289-291, XP000828177, ISSN: 0928-4931.

* cited by examiner

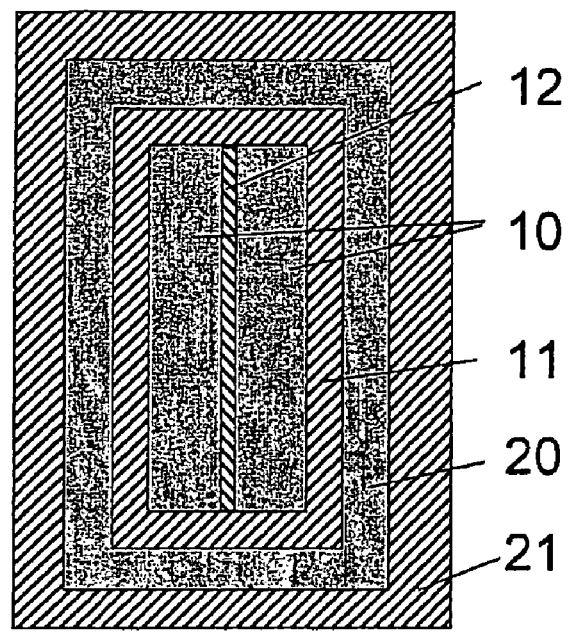
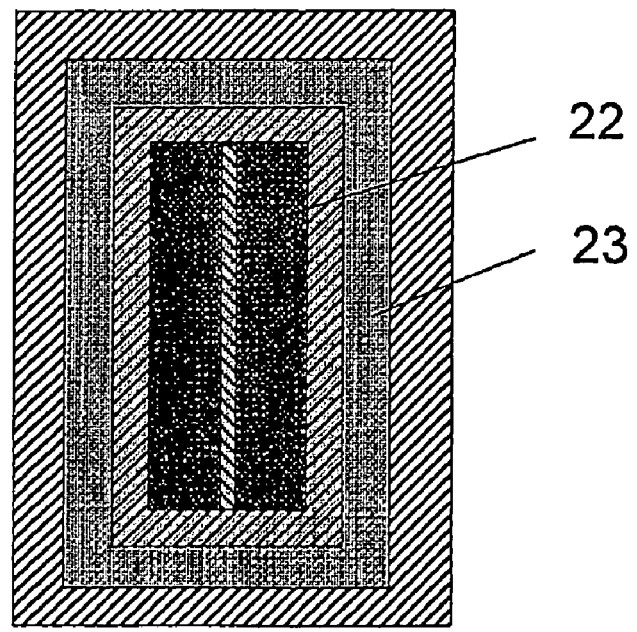
Fig. 6

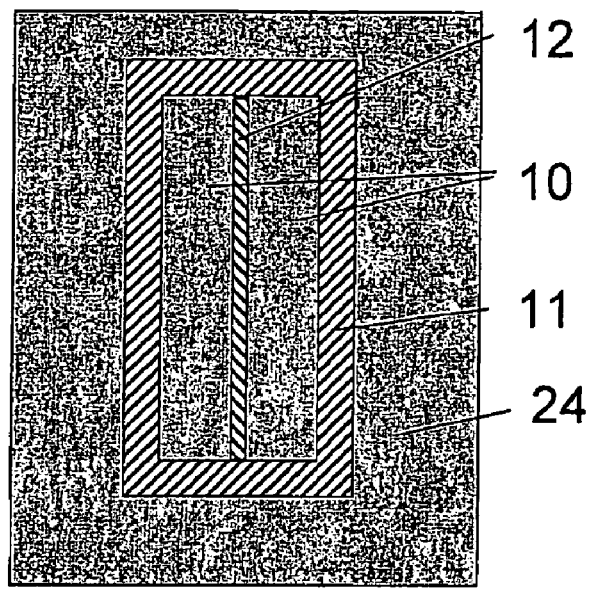
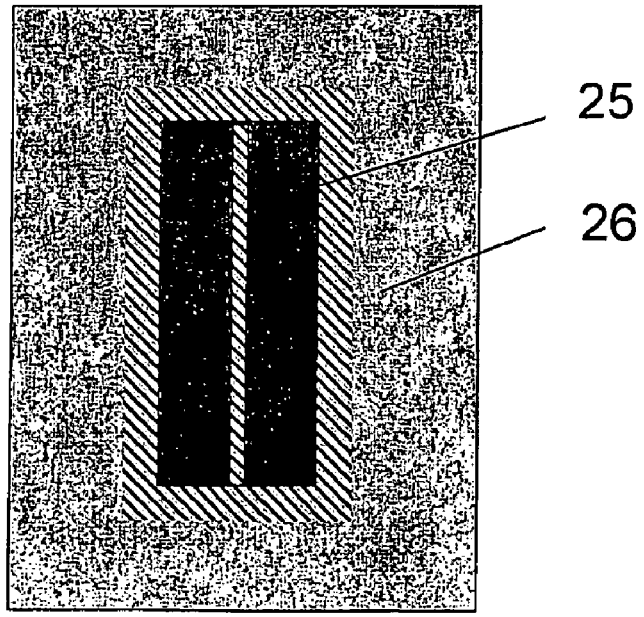
Fig. 7

ACTIVE LAYER ISLAND

BACKGROUND OF THE INVENTION

1. Field of the Invention

Semiconducting conjugated polymer thin-film transistors (TFTs) have recently become of interest for applications in cheap logic circuits integrated on plastic substrates (C. Drury, et al., APL 73, 108 (1998)) and optoelectronic integrated devices and pixel transistor switches in high-resolution active-matrix displays (H. Sirringhaus, et al., Science 280, 1741 (1998), A. Dodabalapur, et al. Appl. Phys. Lett. 73, 142 (1998)). In test device configurations with a polymer semiconductor, inorganic metal electrodes and gate dielectric layers high-performance TFTs have been demonstrated. Charge carrier mobilities up to 0.1 $cm^2/Vs$ and ON-OFF current ratios of $10^6$-$10^8$ have been reached, which is comparable to the performance of amorphous silicon TFTs (H. Sirringhaus, et al., Advances in Solid State Physics 39, 101 (1999)).

Thin, device-quality films of conjugated polymer semiconductors can be formed by coating a solution of the polymer in an organic solvent onto the substrate. The technology is therefore ideally suited to cheap, large-area solution processing compatible with flexible, plastic substrates. To make full use of the potential cost and ease-of-processing advantages it is desirable that all components of the devices including the semiconducting layers, the dielectric layers as well as the conducting electrodes and the interconnects are deposited from solution.

To fabricate all-polymer TFT devices and circuits the following main problems have to be overcome:

Integrity of multilayer structure: During solution deposition of subsequent semiconducting, insulating and/or conducting layers the underlying layers should not be dissolved, or swelled by the solvent used for the deposition of the subsequent layers. Swelling occurs if solvent is incorporated into the underlying layer which usually results in a degradation of the properties of the layer.

High-resolution patterning of electrodes: The conducting layers need to be patterned to form well-defined interconnects and TFT channels with channel lengths $L \leq 10$ μm.

To fabricate TFT circuits vertical interconnect areas (via holes) need to be formed to electrically connect electrodes in different layers of the device.

2. Description of Related Art

In PCT/GB00/04934 a method is described by which high performance transistors with well-defined and controlled channel lengths of less than 10 μm can be fabricated by solution processing in combination with direct printing. The method (see FIG. 1) is based on patterning the surface energy of the substrate 1 into high surface energy, hydrophilic regions 3 and low surface energy, hydrophobic regions 2. When ink droplets of a conducting ink 4, such as the conducting polymer polyethylenedioxythiophene doped with polystyrene sulfonic acid (PEDOT/PSS), are deposited into the high surface energy regions, the droplets spread inside the hydrophilic region, but their spreading is confined when they hit the hydrophobic barriers (FIG. 1B). Alternatively, the droplets can be deposited directly on top of the hydrophobic barrier region defining the channel length L. If the surface energy of the barrier region is sufficiently low, the ink droplets split in half, and deposit on each side of the barrier. In some situations this process is advantageous compared to the one described in FIG. 1B. For a given droplet volume the minimum width of the source and drain electrodes can be lower by up to a factor of two, because the total ink volume splits in half, and each side of the channel barrier contains only half as much ink as if source and drain areas were filled separately. This process results in the formation of source and drain electrodes 5 with very high resolution. Devices are completed by deposition of a continuous or patterned semiconducting active layer 6, a gate dielectric layer 7, and finally a gate electrode 8.

For many applications the active semiconducting layer needs to be patterned into an active layer island. This is necessary in order to reduce electrical crosstalk and eliminate parasitic leakage currents between neighbouring devices. Even if the semiconducting material is not doped, leakage currents through the semiconducting layer can be significant, in particular for circuits with a high packing density of transistors, such as high resolution active matrix displays. In an active matrix display metallic interconnects for pixel addressing are running across the display. If semiconducting material is present underneath such interconnects lines, parasitic TFT channels can form underneath these interconnect lines, giving rise to non-negligible leakage currents between pixels.

Patterning of a semiconductor active layer island can be achieved by inkjet printing an ink of the semiconducting material on top of the predeposited source-drain array (FIG. 1C). Ideally, in applications where integration density is to be maximised, the active layer island should not be much larger than the source-drain electrode pattern. For many inks this is not easy to achieve. Inks for semiconducting material, such as conjugated polymer semiconductors, are often formulated in highly non-polar solvents, such as xylene or mesitylene. These solvents have low surface energies, hence on wetting substrates droplets of such non-polar ink formulations spread to a large diameter, typically 50-200 μm for inkjet droplet volumes of 10-50 pl. On the other hand, inks of conducting materials, such as PEDOT/PSS in water tend to be formulated in more polar, high surface energy solvents, that spread significantly less. In many situations, the diameter of a dried non-polar semiconducting droplet is significantly larger than the combined width of the source and drain electrodes.

In many applications there is less need for patterning of the gate dielectric layer. A continuous layer of gate dielectric deposited, for example, by processes such as blade, spin, spray or extrusion coating can be useful to allow crossing of interconnects at the source-drain and gate level without the need for deposition of additional insulation layers. However, in the case of unpatterned gate dielectric layers via-hole interconnections are required whenever electrodes/interconnects in a top layer need to be connected electrically to electrodes/interconnects in a bottom layer. If the dielectric layer is patterned, however, such connections can simply be established by printing over the edge of the dielectric pattern (PCT/GB00/04942).

BRIEF SUMMARY OF THE INVENTION

According to a first aspect of the present invention method (s) and device(s) are provided as set out in the accompanying independent claims. Preferred features are set out in the dependent claims.

According to one aspect of the present invention a method is provided by which a same surface energy pattern is used for the confinement of a solution of a first material, and subsequently the same surface energy pattern is used for the confinement of a solution of at least one additional material.

According to another aspect of the present invention methods are provided that prevent dewetting of the solution of the additional material from certain narrow features of the surface energy pattern, from which the solution of the first material dewets.

The invention enables fabrication of self-aligned active layer islands for solution-processed, and directly printed TFTs.

The present invention will now be described by way of example, with reference to the accompanying drawings, in which:

BRIEF DESCRIPTION OF THE DRAWINGS

FIG. 6 shows a different design for the surface energy pattern to discourage dewetting of the active layer semiconductor in the region of the channel.

FIG. 7 shows another design for the surface energy pattern to discourage dewetting of the active layer semiconductor in the region of the channel.

DETAILED DESCRIPTION OF THE INVENTION

Figure 1:
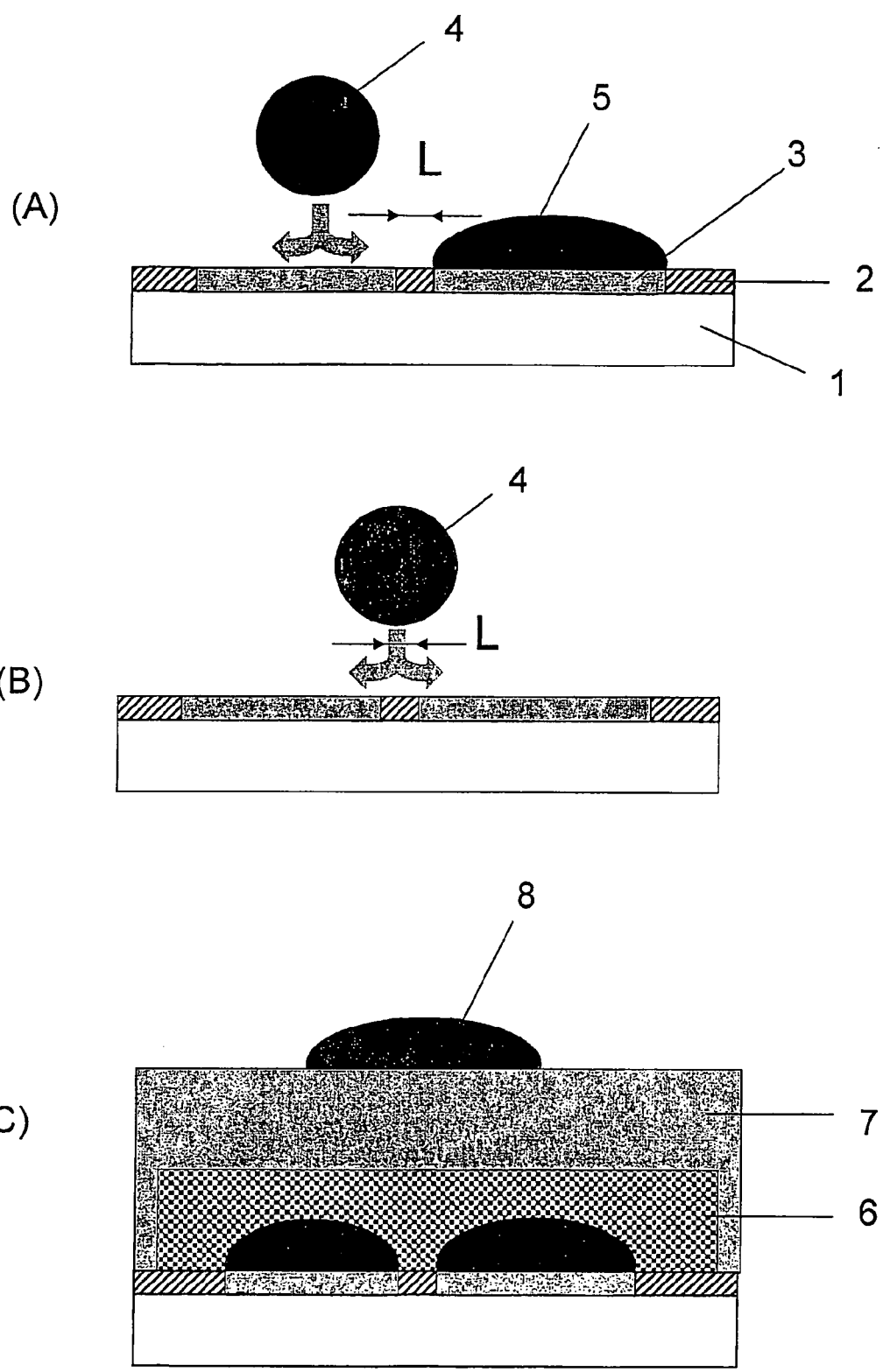
FIG. 1 shows the use of a surface energy pattern for the printing of source-drain electrodes of a TFT with high resolution.
Figure 2:
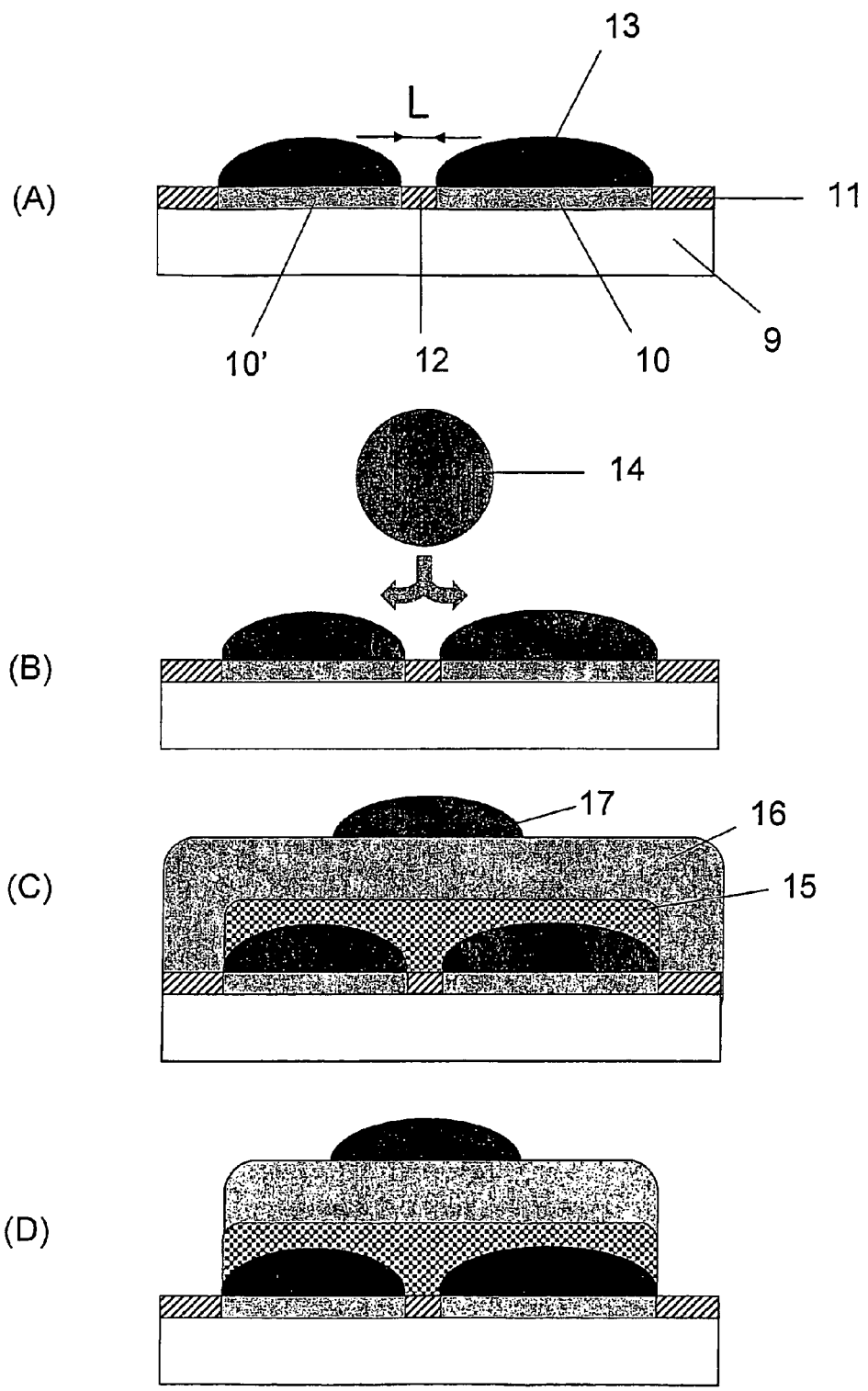
FIG. 2 shows a method by which the same surface energy pattern that is used for the confinement of the ink for source and drain electrodes is also used for the definition of an active layer island of the TFT.

The invention will now be described with reference to FIG. 2. As in PCT/GB00/04934 the process starts with the definition of a surface energy pattern that creates regions of high surface energy 10, and low surface energy 11 and 12 on the substrate 9. Region 12 defines the channel length of the transistor device, region 11 confines the solution for the deposition of source and drain electrode to form source and drain electrodes 13 with a narrow linewidth. The solution for the conducting source-drain electrodes can be deposited by a range of different printing techniques including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, spin-coating, blade coating or dip coating, curtain coating, meniscus coating, spray coating, or extrusion coating. A preferred technique is drop-on-demand inkjet printing.

Subsequently, a solution of the active semiconducting material 14 is deposited from solution. For the deposition of the semiconducting material a broad range of printing techniques can also be used including, but not limited to, inkjet printing, soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, spin-coating, blade coating or dip coating, curtain coating, meniscus coating, spray coating, or extrusion coating. Also here, a preferred technique is drop-on-demand inkjet printing.

The ink formulation and the surface wetting conditions prior to deposition of the semiconducting ink are chosen such that
   a) The solution of the semiconducting material is repelled by the low energy surface region 11, and upon drying of the solvent of the solution no deposition of semiconductor occurs on top of region 11.
   b) The solution of the semiconducting material does not dewet from the low energy surface region 12, and after drying of the solvent forms an essentially continuous film over the channel region 12, that is also in contact with the source and drain electrodes.

It is a key feature of the invention that the semiconducting ink is repelled by surface region 11, but does not dewet from surface region 12. Whereas many conducting materials can be formulated in relatively polar solvents with high surface energies, many semiconducting inks, such as many conjugated polymers, for example, polyalkylthiophene or polyfluorene based semiconducting polymers, need to be formulated in non-polar solvents such as xylene or mesitylene. These solvents have a low surface energy.

It can be shown (see H. Sirringhaus, et al., MRS Bulletin July 2001, page 539) that the repulsive force that is acting on a liquid droplet spreading in a surface region of high surface energy, and then coming in contact with a surface region of low surface energy, is proportional to the surface tension, and to the difference between the dynamic contact angle on the high energy surface $\theta(R_s)$ and the contact angle on the low energy surface $\theta_p$.

$$F_s = \lambda_{LV}(\cos\theta(R_s) - \cos\theta_p)$$

Therefore it is generally more difficult to confine a low surface energy ink by a surface energy pattern than a high surface energy ink, i.e. in many cases the surface energy pattern on the substrate is able to confine the polar conducting ink to region 10, but the subsequently deposited semiconducting ink will not be sufficiently repelled by the surface region 11. In order to confine a low surface energy ink, the surface region 11 needs to exhibit a contact angle for the semiconducting ink that is significantly higher than that on the surface of the conducting ink 13. Preferably the difference in contact angle between the two regions is higher than 10°, more preferably higher than 30°.

Various techniques can be used to produce surface barrier layers that produce a high contact angle for non-polar semiconducting inks. In one embodiment of the invention the surface of the substrate is fluorinated in regions 12 and 11. A fluorinated surface has a lower surface energy than most common non-polar solvent inks, and is therefore capable of confining both the polar conducting ink and the non-polar semiconducting ink. Selective fluorination of the substrate surface can be achieved in a range of different ways:
   Deposition of a layer of polymer, such as hydrophobic polyimide onto a glass substrate 9, followed by patterning of the polymer so as to define opening regions 10 where the bare substrate is exposed. Then the substrate is exposed to a plasma treatment of $CF_4$ or other fluorinated gaseous species. $CF_4$ selectively fluorinates the surface of the polymer, but does not modify the surface properties of the glass substrate to the same degree. The patterning of the polymer can be achieved, for example, by photolithographic patterning, thermal transfer printing or direct write exposure to a focussed light beam (GB 0116174.4).

Deposition of a fluorinated self-assembling monolayer (SAM) molecule, such as a fluorinated tri-/di-/mono-chlorosilane, or tri-/di-/mono-alkoxysilane, onto a substrate to which the monolayer can form a covalent bond. Patterning of the SAM molecule can be achieved by techniques such as, but not limited to, soft lithographic stamping, photolithography, exposure to focussed light beams, or embossing of the substrate followed by contact with a flat stamp inked with the SAM molecule.

It is an advantageous feature of the invention that the surface energy pattern used for the confinement of the semiconducting ink is essentially the same surface energy pattern that is responsible for the confinement of the conducting ink. However, after deposition of the conducting source and drain electrodes and prior to the deposition of the semiconducting material the substrate may be subject to a surface treatment step in order to control the wetting conditions of the semiconducting ink on the various surface regions 13, 12, 11, and possibly uncovered surface regions 10. This surface treatment may selectively increase the surface energy of the conductive material. This surface treatment may also involve a patterning or masking step by which some regions are protected during such a surface treatment step. However, preferably there is no additional patterning step associated with such surface treatment.

An alternative technique to achieve confinement of the semiconducting ink is to make use of surface roughness effects. On a microscopically rough surface the contact line of a spreading droplet is easily pinned. When a droplet of semiconducting ink hits a microscopically rough surface region 11, spreading comes to a halt, and the contact lines becomes pinned at the boundary of regions 11 and 10/13. The surface roughness effect can also be used in combination with a surface energy contrast in order to enhance the ability of region 11 to confine the incoming droplet.

The microscopic surface roughness can be generated by a range of techniques such as, but not limited to:

Physical or chemical etching of a patterned layer deposited onto the substrate. For example, the layer may have more than one component, with one component having a higher etch rate than the other components. An example of such a material is a patterned layer of a blend of two or more polymers, where one of the polymers can be dissolved selectively by exposing the layer to a solvent in which the other polymer(s) is (are) not soluble or are only poorly soluble.

Embossing of a surface layer: A soft layer of polymer patterned on top of a more rigid substrate can be embossed with an embossing tool containing a high density of sharp protruding structures that define an array of topographic features such as linear grooves or pits in the polymer layer.

Bombardment of a substrate containing a patterned surface layer with ions, such as sputtering with argon ions.

Exposure of the substrate to light either through a shadow mask or using a focussed light beam scanned across the surface.

Mechanical rubbing of the substrate.

Annealing of the substrate.

It is another preferred feature of the invention that the semiconducting ink, in spite of being repelled from surface region 11, does not dewet from surface region 12 (in contrast to the ink of the conducting material). In one embodiment of the invention this is achieved by controlling the surface energies of regions 11 and 12 separately, i.e. by preparing surface region 12 in a state with slightly higher surface energy than region 11. Of course the surface energy of region 12 always needs to be low enough as to repel the ink of the conducting material. However, such a process usually requires a separate patterning step in order to define the differential surface energy contrast between regions 12 and 11. Preferably, dewetting of the semiconducting ink from region 12 is avoided without a surface energy contrast between regions 11 and 12, i.e., without an additional patterning step.

In order to prevent dewetting from region 12 it is also preferred that the semiconducting ink is deposited directly on top of region 12, as opposed to being deposited into region 13.

Dewetting of the semiconductive ink from region 12 can proceed by two different processes:

(a) The deposited droplet shrinks from one of regions 10 or 10', crosses the boundary 12, and becomes confined to the other of regions 10' or 10. This can be prevented by preparing the surface of region 10, 10' in a wetting state prior to deposition of the semiconductive ink, and, or by preparing the side walls of the boundary between regions 10,10' and region 11 in a high-energy, wetting state. The latter situation can be achieved, for example, by etching of a hydrophobic polymer by oxygen plasma to uncover the substrate surface in regions 10,10' while the hydrophobic polymer is protected by a resist layer in regions 11, and 12.

(b) The deposited droplet covers both regions 10 and 10', but when the thickness of the drying droplet becomes thinner than some critical thickness, the droplet splits into two droplets, one located in region 10, the other one located in region 10'. The splitting of the droplet is driven by the unfavourable interface energy between the droplet and the surface in region 12. If the droplet is thin enough the energy penalty which is associated with the increase in surface energy upon droplet splitting is not large enough to prevent the droplet from splitting.

Below we list several different embodiments of the invention by which the splitting of droplets and dewetting from region 12 can be prevented.

Surface tension of the semiconductive ink: A high surface tension of the semiconductive ink increases the energy penalty for splitting the droplet, and tends to suppress droplet splitting.

Control of surface tension of substrate: The surface tension of the substrate $\gamma sv$ in region 12 and 11 (assumed here to be of identical surface composition) can be controlled such that $\gamma sv^{min} < \gamma sv < \gamma sv^{max}$, where $\gamma sv^{max}$ is the maximum surface tension that still provides efficient repulsion of the inks of both the conducting and the semiconducting material from region 11 and $\gamma sv^{min}$ is the minimum surface tension below which dewetting of the ink occurs on region 12. The substrate surface tension can be varied, for example, by altering the chemical composition of the substrate, or by exposing the substrate to a surface treatment or electromagnetic radiation, or by controlling the temperature and humidity conditions before and during the deposition.

Increasing the viscosity of the semiconducting ink: A high solution viscosity facilitates ink confinement, as it reduces the kinetic energy of the contact line of the spreading droplet. A high viscosity also prevents dewetting on top of region 12, because it reduces the mobility and flow of molecules in solution that is required to split one droplet into several separate isolated droplets. The viscosity can also be controlled by judicious choice of solvents, addition of co-solvents, or by increasing the concentration and/or molecular weight of a semiconducting polymer in solution, or by lowering of the solution temperature.

Thickness of the surface energy barrier in region 12: By reducing the thickness of the surface energy barrier in region 12, the energy penalty for splitting the droplet can be reduced. The thicker the surface energy barrier is, the thinner the liquid film on top of the barrier becomes, facilitating droplet splitting.

Decreasing drying time: The dewetting process occurs on a different time scale from that of the ink confinement process. During the initial fast spreading of the droplet the solution covers the whole of areas 13 and 12, and is repelled from region 11. Dewetting tends to occur on a longer time scale during the drying of the solution. If the solution is formulated in a low boiling point solvent or if the evaporation rate of the solvent is enhanced, for example by depositing the solution onto a heated substrate, exposing the substrate to electromagnetic radiation during deposition and drying, or by depositing under a flow of "dry", inert gas, the drying time is decreased. The viscosity of the solution increases rapidly during drying, and by the time dewetting would occur, the solution viscosity is already so high that dewetting is suppressed.

Controlling the total volume of liquid: In the case of inkjet deposition the amount of liquid that is deposited can be controlled by the ejection frequency, the drive conditions of the inkjet head, and by the speed at which the sample is moving underneath the printhead. The larger the initial amount of semiconductive ink deposited into regions 10, 10' and 12, the less likely it is that the droplet will split into two separate droplets. This is because by the time the drying droplet becomes so thin that splitting of the droplet would become energetically favourable the viscosity is high enough to prevent the splitting of the droplet.

Figure 3:
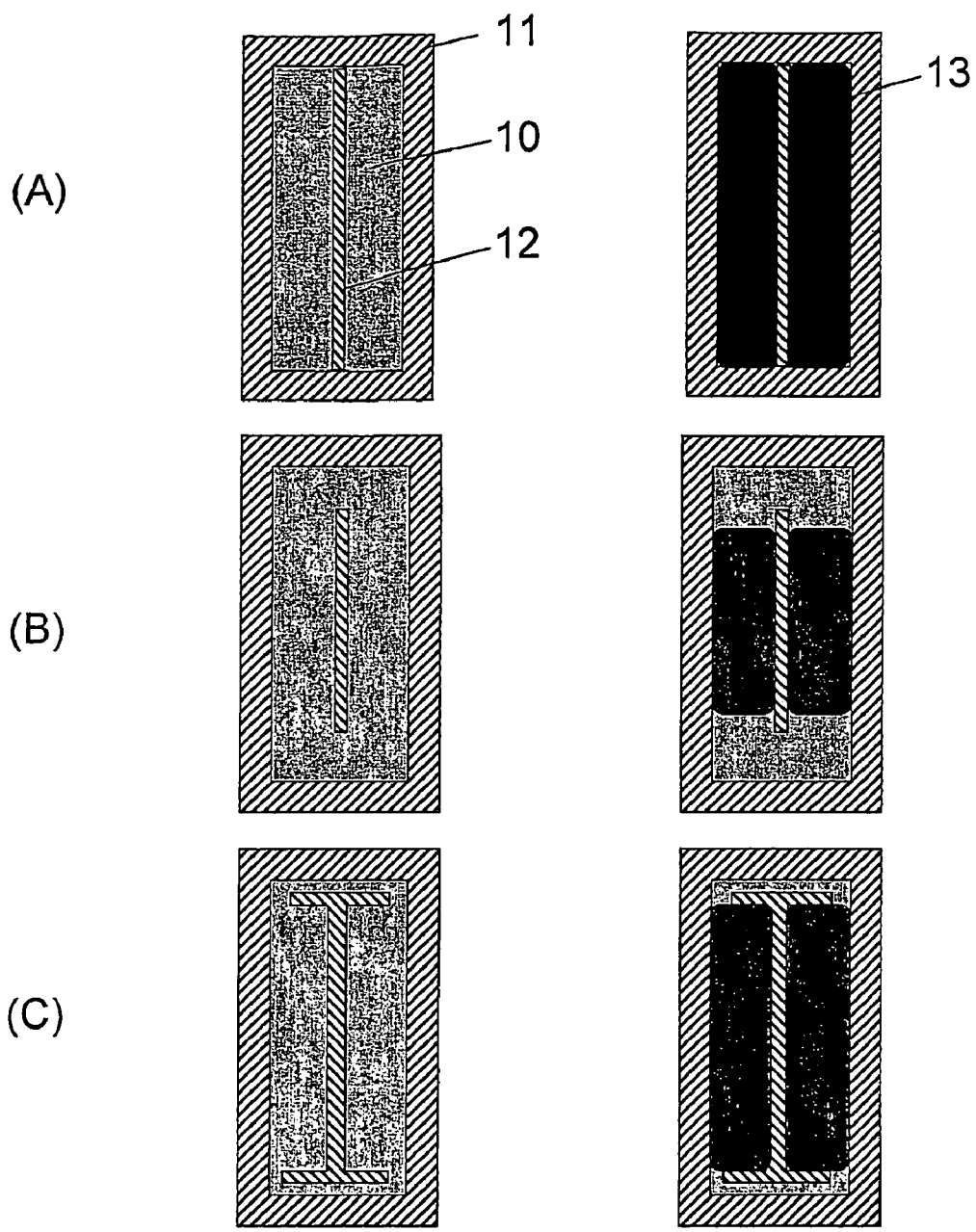
FIG. 3 shows top-view drawings of various designs for the surface energy pattern designed to discourage dewetting of the active layer semiconductor in the region of the channel.
Figure 4:
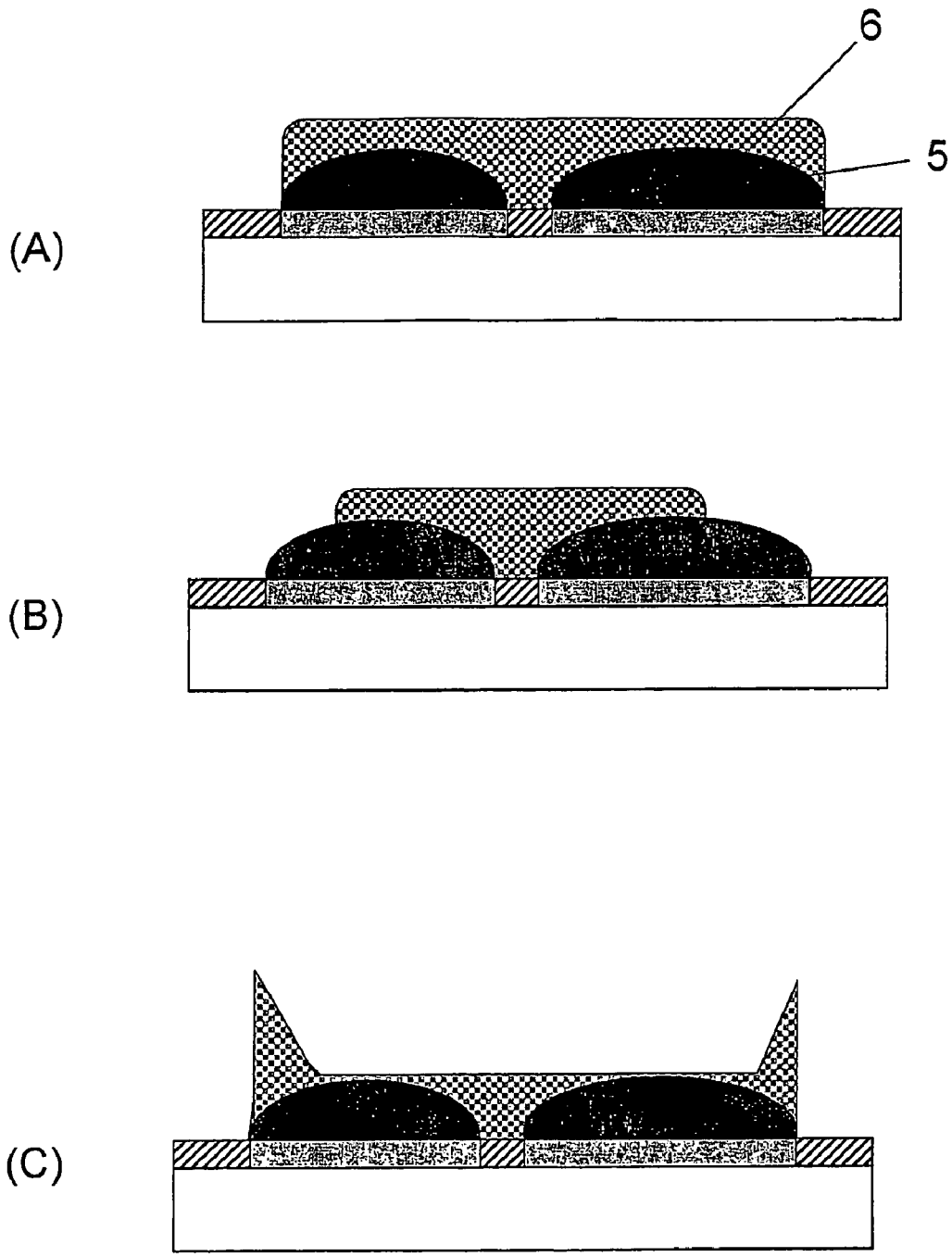
FIG. 4 shows different drying modes of the semiconducting solution.

Design of the surface energy pattern: The surface energy pattern can be designed in such a way that at the edges of region 12 areas of high surface energy 10 are incorporated that are not covered by conducting material, but fix (pin) the contact line of the semiconducting ink. Once the contact line is pinned, i.e. semiconducting material starts to dry at the edge of the still liquid droplet, the tendency of the droplet to dewet is much suppressed. Illustrative examples for possible pattern design are shown in FIG. 3. In FIG. 3A the whole of surface region 10 is filled with conductive material. During deposition of the semiconducting ink, the droplets have a tendency to dewet and split into two droplets starting at the two boundary regions where regions 12 and 11 meet. This can be avoided by the design illustrated in FIG. 3B or FIG. 3C, which replace the direct link between low surface energy regions 11 and 12 with a narrow high surface energy region 10. This region is not filled with conducting material. During the drying of the semiconducting ink the entire contact line is located in a region of high surface energy, and dewetting is prevented. The design in FIG. 3C allows to minimize the surplus area of the active layer island extending beyond the area of the conducting electrodes.

An alternative design is shown in FIG. 6. This embodiment is particularly preferred in cases where the dried conductive ink itself has a relatively low surface energy. In this case the topology of the surface energy pattern that is defined prior to the deposition of the conductive ink is more complex consisting of spatially separated high surface energy regions 10, 20, and low surface energy regions 11, 12, and 21. The conductive ink 22 is deposited in such a way that it is confined to region 10 while dewetting from region 11 and 12. The volume and position of deposited liquid droplets is adjusted such that the conductive ink is not brought in contact with region 20. Subsequently, the semiconductive ink 23 is deposited, and the volume of ink is adjusted such that the ink fills region 20, but is repelled from region 21, while covering regions 10, 11, 12, and 20. In this case the contact line of the semiconductive ink droplet is located everywhere on top of a high surface energy region, minimizing the tendency of the semiconductive ink to dewet during drying from the critical, low surface energy channel region 12.

A further embodiment of the present invention, by which dewetting of the semiconductive solution from the channel region 12 can be prevented, incorporates a highly hydrophobic surface energy barrier 11, 12, which in spite of its hydrophobic character, exhibits good wetting for the semiconducting solution (FIG. 7). This may be due to a favourable interfacial interaction between the semiconducting solution and the surface energy barrier, such as swelling of the surface energy barrier by the solvent of the semiconducting solution. An example of such a surface energy barrier material is BCB (benzocyclobutene/mesitylene). A layer of BCB polymer may be deposited from a solvent, such as xylene. The thin film of BCB may be patterned to create a surface energy pattern containing regions of high surface energy 10, and 24 and low surface energy 11 and 12 on the substrate. The patterning of the polymer may be achieved by processes such as, but not limited to, photolithographic patterning, thermal transfer printing or direct write exposure to a focussed light beam (GB 0116174.4).

Figure 9:
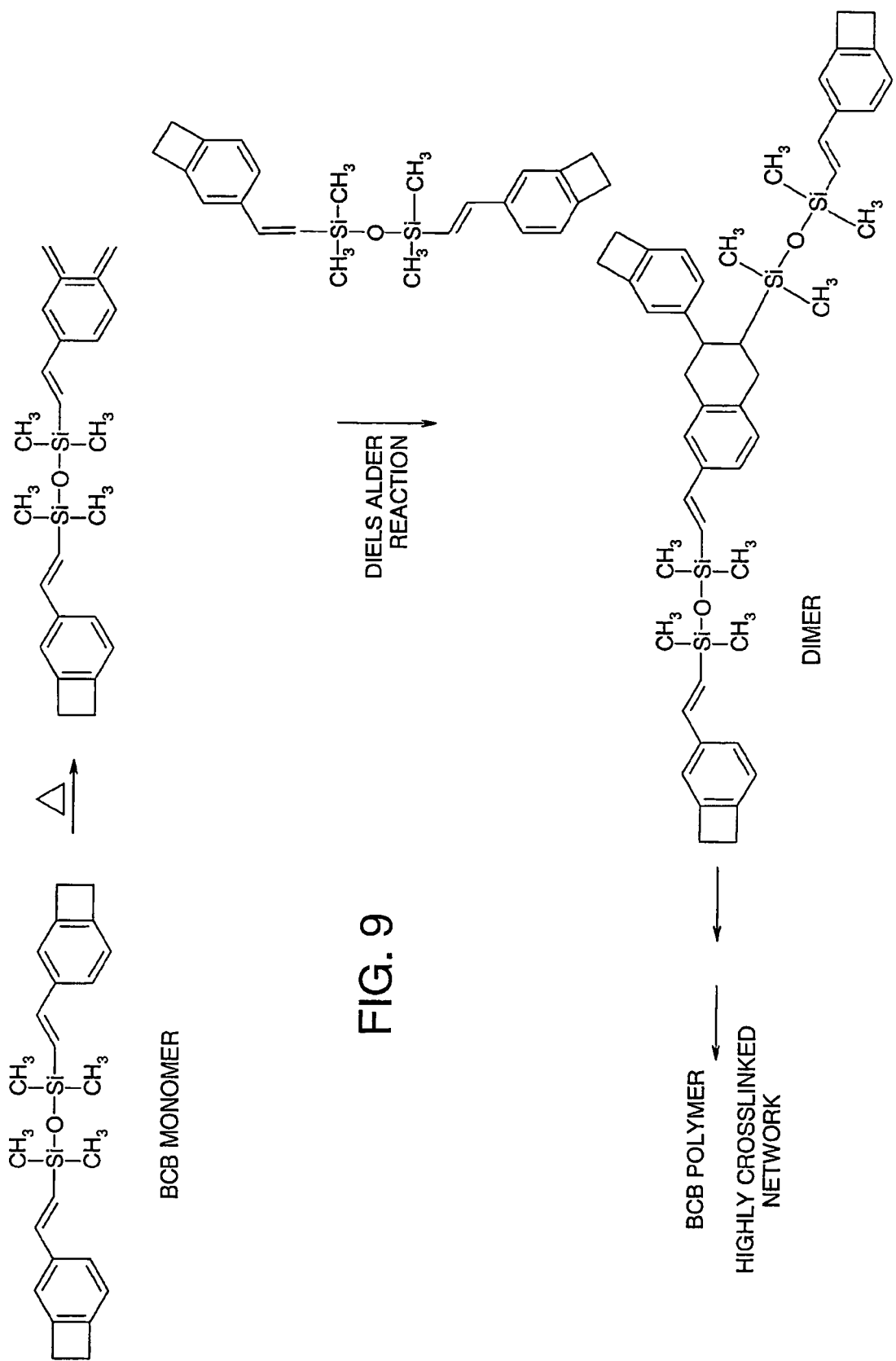
FIG. 9 shows a mechanism for polymerisation of BCB.

FIG. 9 shows a mechanism for polymerisation of BCB. The BCB monomer and the BCB polymer include Si—O—Si moieties. The Si—O—Si moieties have $CH_3$ side-groups. Other polymers having Si—O—Si moieties can advantageously be used.

Conducting source and drain electrodes 25, preferably consisting of polyethylenedioxythiophene doped with polystyrene sulfonic acid (PEDOT/PSS), may be deposited on regions of high surface energy, leaving the hydrophobic BCB areas to act as barriers to the printed electrodes. A semiconductor layer, preferably F8T2 poly(dioctylfluorene-co-bithiophene) 26 is deposited from a solvent and deposited over the source and drain contacts. The solvent is chosen such that it is capable of swelling the BCB and is preferably a substituted benzene compound and most preferably 1,2,3,4-tetramethylbenzene. The semiconductor is wetting to the low energy hydrophobic patterned BCB regions on the substrate and therefore to the channel region of the device. The importance of the surface energy of the patterned BCB to the functioning of the device has been previously shown. In devices where the surface energy of the patterned material has been too low, the semiconductor dewets from the patterned material and is repelled from the channel region.

As the BCB is very wetting to the semiconductor, the semiconductor becomes pinned at the BCB/substrate interface therefore favouring the BCB regions to the exposed substrate. Additionally, the semiconductor solvent is capable of swelling the BCB material. The swelling effect further aids the confinement of the semiconductor to the BCB regions. This embodiment has an added advantage of being a single step process, without the need for further surface treatment or developing steps.

Figure 8:
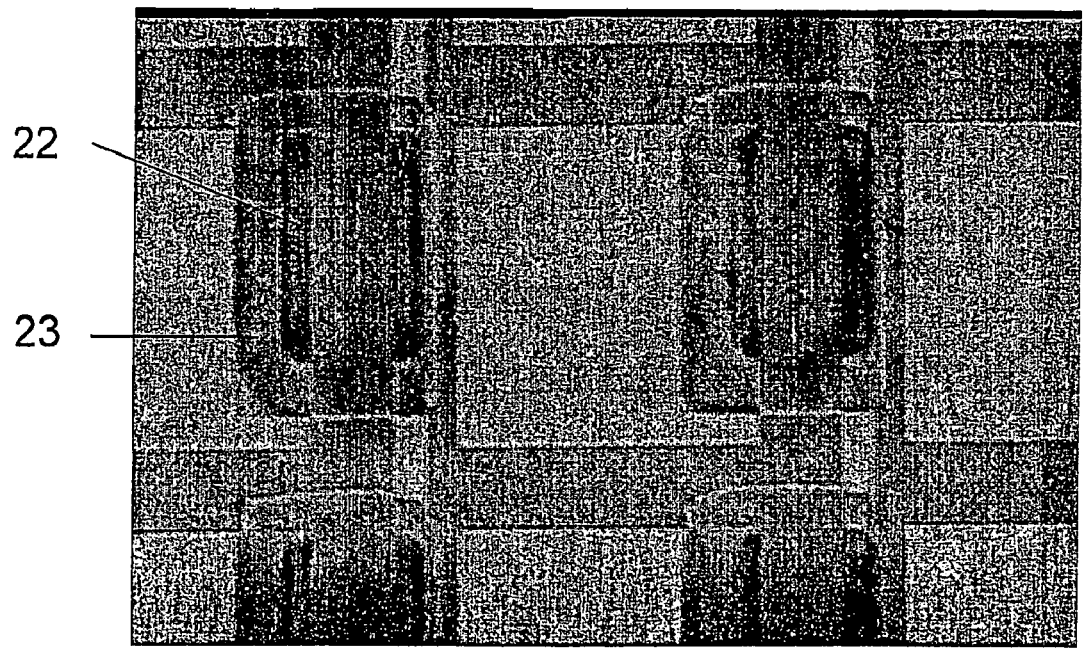
FIG. 8 shows a photograph of an inkjet printed active semiconducting active layer island of F8T2 and PEDOT source-drain electrodes both confined by a common surface energy pattern defined by patterning a layer of BCB on a glass substrate by thermal imaging.

FIG. 8 shows a photograph of an inkjet printed active semiconducting active layer island of F8T2 and PEDOT source-drain electrodes both confined by a common surface energy pattern defined by patterning a layer of BCB on a glass substrate by thermal imaging.

Depending on the line width of the conductive pattern in region 10 and the liquid volume of the semiconducting solution the semiconductive solution might be confined to region 12 and part of region 10. However, in many cases the semiconductive solution will spread further into region 11. Due to the favourable interaction between the semiconductive solution with the surface energy barrier the latter has little confinement effect onto the semiconductive solution in this case. However, confinement can still be achieved by surface energy pattern designs such as the one shown in FIG. 6. The semiconductive ink will readily be in contact with region 11, but will then be repelled by region 20 due to the unfavourable interface interaction of the semiconductive solution with the high energy surface in region 20. In this case region 21 shown in FIG. 6 can be omitted, and the high energy surface of the underlying substrate in region 20 can be used to confine the semiconducting solution.

Figure 5:
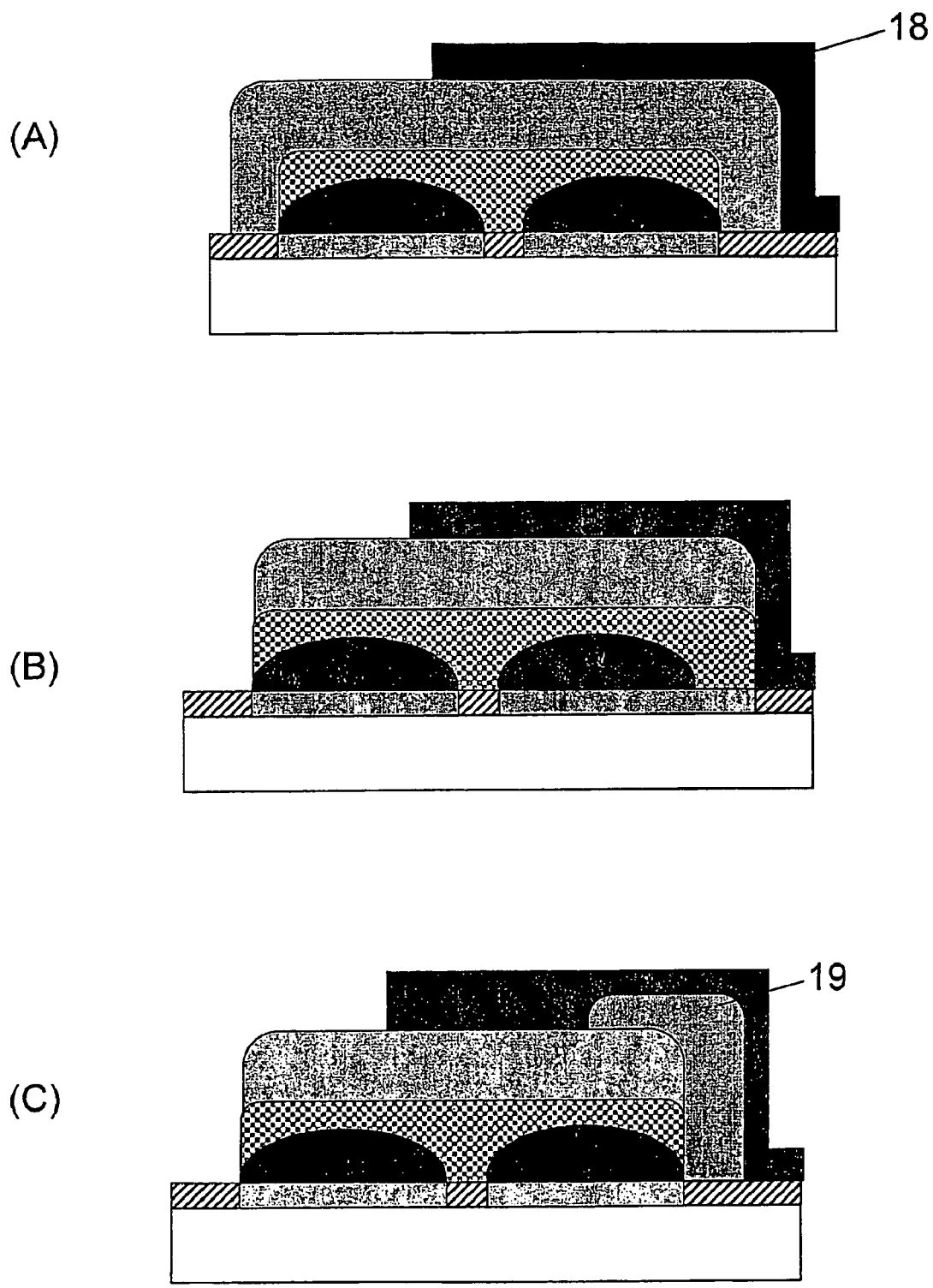
FIG. 5 shows methods by which electrical interconnects to the gate electrode can be formed in the case of a patterned dielectric layer.

Another important requirement for fabrication of high performance devices is the drying profile of the semiconducting ink material. It is desirable that the thickness of the semiconducting active layer island (typically on the order of 10-100 nm) is as homogeneous as possible over the dimension of the device (FIG. 5A). In some cases, after being repelled by the high surface energy region 11, the semiconducting ink droplet might further recede before drying with a contact line no longer in contact with the boundary between regions 13 and 11 (FIG. 5B). This is not necessarily problematic as long as the film remains sufficiently thin and continuous in the region of the active channel, and remains in contact with both the source and drain electrodes.

However, more commonly in the case of low surface tension inks the ink tends to dry in a "coffee-stain" drying mode, where the contact line becomes pinned at the boundary of regions 11 and 13, and a flow of liquid and material towards the edge of the droplet is established. This flow is driven by the higher rate of liquid evaporation near the edge of the droplet than at its centre. Material is therefore deposited preferentially at the edges of the droplet (FIG. 5C). In most cases this is undesirable, as it results in very thin, and possibly discontinuous films in the active channel region of the device. It also increases the tendency of the droplets to dewet from the very thin central region 12.

Coffee-stain drying can be prevented by increasing the viscosity of the solution, reducing the evaporation time, for example by using lower boiling point solvents, deposition at elevated temperature, exposing the substrate to electromagnetic radiation during deposition and drying, or flowing a stream of "dry" inert gas over the substrate during deposition. In this way a highly viscous solution state is reached more quickly, before all the material has flown to the edges of the droplet.

After deposition of the semiconducting active layer island, the devices are completed by deposition of a gate dielectric layer with a thickness of typically 50 nm to 2000 nm and a conducting gate electrode. As mentioned above, the gate dielectric may either be in the form of a continuous layer (fabricated by techniques such as spin coating, spray or blade coating), which then requires via-hole interconnections in many applications, or in the form of a patterned active layer island. In the latter case several alternatives are possible. Preferably, the deposition of the dielectric island extends a certain distance beyond the semiconducting active layer island, at least in regions where the gate interconnect 18 is printed over the edge of the dielectric island (FIG. 5(A)).

Formation of a continuous gate dielectric layer, or of the device configuration in FIG. 5(A), requires that the dielectric ink is not strongly repelled from surface region 11. This can be achieved by treating the substrate prior to deposition of the dielectric solution to increase wetting in region 11. Alternatively, interleaved printing can be used, such that a few isolated droplets are deposited first into region 11 without coming into contact with the lower surface energy regions of the device. Once these droplets have dried they provide anchoring points which allow printing of a continuous dielectric layer covering the active device area and adjacent boundary regions in region 11. As a further alternative printing from a high viscosity solution favours the formation of continuous films on top of low surface energy substrates. In techniques such as inkjet printing the maximum solution viscosity is typically limited to 20-40 cpi, but with techniques such as screen printing even higher viscosity formulations can be deposited.

An alternative configuration is often observed for highly fluorinated surface energy barriers and is shown in FIG. 5B. In this case the dielectric ink is strongly repelled by surface region 11, and its deposition is confined to the active layer island. In this case it is possible to avoid electrical shorts between the gate interconnects printed over the edge of the dielectric island and one of the source and drain electrodes if region 10 is not filled completely filled with conducting material such as for example in the device configurations shown in FIG. 3(B) and (C). Alternatively a separate dielectric material 19 (FIG. 5(C)) can be deposited over the edge of the dielectric island to prevent electrical shorting and reduce leakage currents.

According to one embodiment of the invention a 50 nm thick film of polyimide is deposited on top of a 1737 glass substrate. The polyimide film is patterned by photolithography, followed by oxygen plasma etching to expose the bare glass substrate in surface region 10. Typical lateral dimension of region 12 are L=0.1-10 µm, the width of region 10 is typically on the order of 20-60 µm. Then the substrate is exposed to a $CF_4$ plasma treatment (50-100 W for 5 min), during which the hydrophobic polyimide bank regions 11 and 12 are fluorinated. Subsequently, source-drain electrode are formed by inkjet printing PEDOT/PSS droplets into region 10 and/or on top of region 12. Then an ink of the semiconducting polymer poly(dioctylfluorene-co-bithiophene) formulated in a solvent which is preferably xylene or mesitylene and most preferably 1,2,3,4-tetramethylbenzene, is inkjet printed on top of region 12. The ink is repelled from region 11, but it does not dewet on top of region 12. Then a 700-1300 nm thick film of polymethylmethacrylate (PMMA) in butylacetate is deposited by spin coating at a speed of 2000 rpm. The surface of the PMMA is then made wetting by a short $O_2$ plasma exposure (50 W, 30 s), and a gate electrode of PEDOT/PSS is inkjet printed on top.

The processes and devices described herein are not limited to devices fabricated with solution-processed polymers. Some of the conducting electrodes of the TFT and/or the interconnects in a circuit or display device (see below) may be formed from inorganic conductors that can, for example, be deposited by printing of a colloidal suspension or by electroplating onto a pre-patterned substrate. In devices in which not all layers are to be deposited from solution one or more PEDOT/PSS portions of the device may be replaced with an insoluble conductive material such as a vacuum-deposited conductor.

For the semiconducting layer any solution processible conjugated polymeric or oligomeric material that exhibits adequate field-effect mobilities exceeding $10^{-3}$ $cm^2/Vs$, preferably exceeding $10^{-2}$ cm$^2$/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or inorganic semiconductor nanowires (X. Duan, Nature 425, 274 (2003)).

The electrodes may be coarse-patterned by techniques other than inkjet printing. Suitable techniques include soft lithographic printing (J. A. Rogers et al., Appl. Phys. Lett. 75, 1010 (1999); S. Brittain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. Inkjet printing is considered to be particularly suitable for large area patterning with good registration, in particular for flexible plastic substrates.

Although preferably all layers and components of the device and circuit are deposited and patterned by solution processing and printing techniques, one or more components may also be deposited by vacuum deposition techniques and/or patterned by a photolithographic process.

Devices such as TFTs fabricated as described above may be part of a more complex circuit or device in which one or more such devices can be integrated with each other and/or with other devices. Examples of applications include logic circuits and active matrix circuitry for a display or a memory device, or a user-defined gate array circuit.

The patterning process may be used to pattern other components of such circuits as well, such as interconnects, resistors, capacitors etc.

The present invention is not limited to the foregoing examples. Aspects of the present invention include all novel and/or inventive aspects of the concepts described herein and all novel and/or inventive combinations of the features described herein.

The devices described above could be supplemented by other conductive and/or semiconductive structures on the same substrate, for example interconnects. Multiple devices as described above may be formed on the same substrate, and may be connected together by electrically conductive interconnects to form an integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method for forming on a substrate an electronic device including at least one electrically conductive material and one semiconductive material, the materials being deposited onto the substrate from respective liquids, the method comprising:
    forming on the substrate a surface energy pattern that defines a first area of the substrate, a second area of the substrate spaced apart from the first area of the substrate by a spacing area, and a third area of the substrate at least partly overlapping the first area, the second area and the spacing area; and subsequently:
    depositing the electrically conductive material on the substrate by applying the liquid comprising the electrically conductive material over the substrate; and
    depositing the semiconductive material on the substrate by applying the liquid comprising the semiconductive material over the substrate; wherein
    the surface energy pattern is such as to localise the electrically conductive material to the first and second areas and to localise the semiconductive material to the third area; and
    the semiconductive material is deposited so as to extend over the third area continuously between the conductive material in the first area and the conductive material in the second area.

2. A method as claimed in claim 1 wherein the semiconductive material is deposited so as to cover substantially the whole of the spacing area between the first area and the second area.

3. A method as claimed in claim 1 wherein the surface energy pattern is such that the semiconducting material is attracted more strongly to the spacing area than to the first and second areas.

4. A method as claimed in claim 1 wherein the surface energy pattern is such that the semiconductive material is attracted more strongly to the first and second areas than to the spacing area.

5. A method as claimed in claim 1 wherein the surface energy pattern further comprises a fourth area surrounding the region comprising the first and second areas and the spacing area.

6. A method as claimed in claim 5 wherein the surface energy pattern further comprises a fifth area surrounding the fourth area.

7. A method as claimed in claim 1 wherein the spacing area has a higher repellence for the conductive material than the first and second areas.

8. A method as claimed in claim 5 wherein the fourth area has a higher repellence for the semiconductive material than the third area.

9. A method as claimed in claim 2 wherein:
    the surface energy pattern comprises further areas, one of the further areas being adjacent to a first end of the spacing area and another of the further areas being adjacent to an opposite end of the spacing area; and
    the repellence of the further areas relative to the repellence of the spacing area to the liquid of the semiconductive material is such that on deposition of the semiconductive material the semiconductive material is encouraged to cover substantially the whole of the spacing area.

10. A method as claimed in claim 1, wherein the width of the spacing area between the first and second areas is less than 20 microns.

11. A method as claimed in claim 1, wherein the width of the spacing area between the first and second areas is less than 1 micron.

12. A method as claimed in claim 1, wherein the electrically conductive material formed in the first and second areas forms source and drain electrodes of a transistor.

13. A method as claimed in claim 1, wherein the semiconductive material formed in the third area is an active semiconducting island of a transistor.

14. A method as claimed in claim 1, wherein the surface energy pattern of the substrate is formed using fluorinated species.

15. A method as claimed in claim 14 wherein the surface energy pattern of the substrate is formed by exposure of the substrate to a plasma treatment.

16. A method as claimed in claim 15 wherein the surface energy pattern of the substrate is formed by exposure of the substrate to a $CF_4$ plasma treatment.

17. A method as claimed in claim 14 wherein the surface energy pattern of the substrate is formed by exposure of the substrate to a fluorinated self-assembling monolayer molecule.

18. A method as claimed in claim 1, wherein the surfaces of the first and second areas are of substantially identical composition.

19. A method as claimed in claim 1, wherein the first and second areas are formed on an exposed surface of a layer deposited on a planar structural member.

20. A method as claimed in claim 1, wherein the surface of the substrate has a lower surface roughness in the first and second areas than in regions surrounding the first and second areas.

21. A method as claimed in claim 1, wherein the viscosity of the liquid comprising the semiconductive material is higher than 5 cpi.

22. A method as claimed in claim 1, wherein the boiling point of the liquid comprising the semiconductive material is less than 180° C.

23. A method as claimed in claim 1, wherein the substrate is held at a temperature above 40° C. while the liquid comprising the semiconductive material is deposited.

24. A method as claimed in claim 1, wherein the temperature of the liquid comprising the semiconductive material is less than 20° C.

25. A method as claimed in claim 1, wherein a flow of gas is directed onto the substrate surface during the deposition of the semiconductive material.

26. A method as claimed in claim 1, wherein the contact angle difference of the liquid comprising the semiconductive material on the surface of the spacing area, is larger by more than 10° than its contact angle on the surface of the first and second areas.

27. A method as claimed in claim 26, wherein the contact angle of the liquid comprising the semiconductive material on the surface of the spacing area, is larger by more than 30° than its contact angle on the surface of the conductive material in the first and second areas.

28. A method as claimed in claim 1, wherein the contact angle of the liquid comprising the semiconductive material on the surface of the spacing area is smaller than 100°.

29. A method as claimed in claim 28, wherein the contact angle of the liquid comprising the semiconductive material on the surface of the spacing area is smaller than 60°.

30. A method as claimed in claim 19 wherein the thickness of said layer is less than 500 Å.

31. A method as claimed in claim 30 wherein the thickness of said layer is less than 200 Å.

32. A method as claimed in claim 1 wherein the surface tension of said liquid comprising the semiconductive material is higher than 25 $mJ/m^2$.

33. A method as claimed in claim 1, wherein said electrically conductive or semiconductive material is deposited by droplet deposition.

34. A method as claimed in claim 1, wherein said electrically conductive or semiconductive material is deposited by ink-jet printing.

35. A method as claimed in claim 1 wherein said electrically conductive material is a polymer.

36. A method as claimed in claim 1, wherein the electrically conductive material is an inorganic particulate material capable of suspension in the said liquid.

37. A method as claimed in claim 1, wherein the semiconductive material is a conjugated organic molecule.

38. A method as claimed in claim 37, wherein the semiconductive material is a conjugated polymer.

39. A method as claimed in claim 6, wherein the spacing area, and the fourth area are less repulsive to the liquid comprising the semiconductive material than the first, second and fifth areas.

40. A method as claimed in claim 39, wherein the liquid comprising the conductive material is confined to the first and second area by the repellence of the fourth area and the spacing area, and the semiconductive material is confined to the third area by the repellence of the fifth area.

41. A method as claimed in claim 39, wherein the spacing area and the fourth area are of substantially identical surface energy.

42. A method as claimed in claim 39, wherein the first, second and fifth area are of substantially identical surface energy.

43. A method as claimed in claim 39, wherein conductive material is absent from the fifth area.

44. A method as claimed in claim 1 wherein the liquid comprising the semiconductive material is capable of swelling the spacing area.

45. A method as claimed in claim 44, wherein the surface of the spacing area comprises a polymer that is swelled by the liquid comprising the semiconductive material on deposition of the semiconductive material.

46. A method as claimed in claim 45, wherein said polymer is a polymer containing an Si—O—Si moiety.

47. A method as claimed in claim 46, wherein the polymer is a polymer derived from a substituted benzocyclobutene.

48. A method as claimed in claim 1 further comprising the step of depositing at least one further material on top of the conductive or semiconductive material.

49. A method as claimed in claim 48 wherein the further material is a dielectric material which is confined, on deposition, by the surface energy pattern.

50. A logic circuit, display, sensor or memory device formed by the method of claim 1.

51. A logic circuit, display, sensor or memory device comprising a plurality of transistors formed by the method of claim 1.

* * * * *